(12) United States Patent
Banaszak et al.

(10) Patent No.: US 10,011,905 B2
(45) Date of Patent: Jul. 3, 2018

(54) AUTOMATIC SUPPLY DEVICE FOR AN INDUSTRIAL METAL VAPOR GENERATOR

(75) Inventors: Pierre Banaszak, Vivegnis (BE); Didier Marneffe, Engis (BE); Bruno Schmitz, Nandrin (BE); Eric Silberberg, Haltinne-Gesves (BE); Luc Vanhee, Oisy-le-Verger (FR)

(73) Assignee: Arcelormittal Investigacion Y Desarrollo SL, Sestao, Bizkaia (ES)

( * ) Notice: Subject to any disclaimer, the term of this patent is extended or adjusted under 35 U.S.C. 154(b) by 1006 days.

(21) Appl. No.: 13/979,598

(22) PCT Filed: Jan. 12, 2012

(86) PCT No.: PCT/EP2012/050432
§ 371 (c)(1),
(2), (4) Date: Dec. 18, 2013

(87) PCT Pub. No.: WO2012/095489
PCT Pub. Date: Jul. 19, 2012

(65) Prior Publication Data
US 2014/0127406 A1 May 8, 2014

(30) Foreign Application Priority Data

Jan. 14, 2011 (EP) .................................... 11151004

(51) Int. Cl.
C23C 14/24 (2006.01)
C23C 16/54 (2006.01)
(Continued)

(52) U.S. Cl.
CPC .............. C23C 16/54 (2013.01); C23C 14/16 (2013.01); C23C 14/246 (2013.01); C23C 14/562 (2013.01)

(58) Field of Classification Search
CPC ....... C23C 14/24–14/243; C23C 14/16; C23C 14/562; C23C 14/246
(Continued)

(56) References Cited

U.S. PATENT DOCUMENTS 5,356,673 A * 10/1994 Schmitt .................. C23C 14/22
118/718
8,481,120 B2 7/2013 Choquet et al.
(Continued)

FOREIGN PATENT DOCUMENTS

EP 0 909 342 A1 4/1999
EP 1972699 A1 9/2008
(Continued)

*Primary Examiner* — Elizabeth A Burkhart
(74) *Attorney, Agent, or Firm* — Reinhart Boerner Van Deuren P.C.

(57) ABSTRACT

The present invention relates to a facility for the continuous vacuum deposition of a metal coating on a substrate in motion, comprising a vacuum deposition enclosure (24), at least one vapor jet deposition head (25,26) connected to an evaporator pot (9) designed to contain the coating metal in liquid form (11), through a vapor supply pipe (20) provided with a distribution valve (19), and a melting furnace (1) for said metal, said furnace being at atmospheric pressure, located below the lowest portion of the evaporator pot (9) and connected to the evaporator pot (9) by at least one automatic supply pipe (8) of the evaporator pot (9) provided with a supply pump (6) and by at least one liquid metal return pipe (8A,18) optionally provided with a valve (16, 17), regulating means for the supply pump (6) further being present to regulate a determined liquid metal level in the evaporator pot (9), characterized in that it comprises, in each said supply and return pipes (8; 8A,18), a so-called heat valve area (7,13,15) provided with a heating device and a cooling device to obtain a regulated temperature, independent of that of the melting furnace (1), that prevailing in the (Continued)

Figure 1:
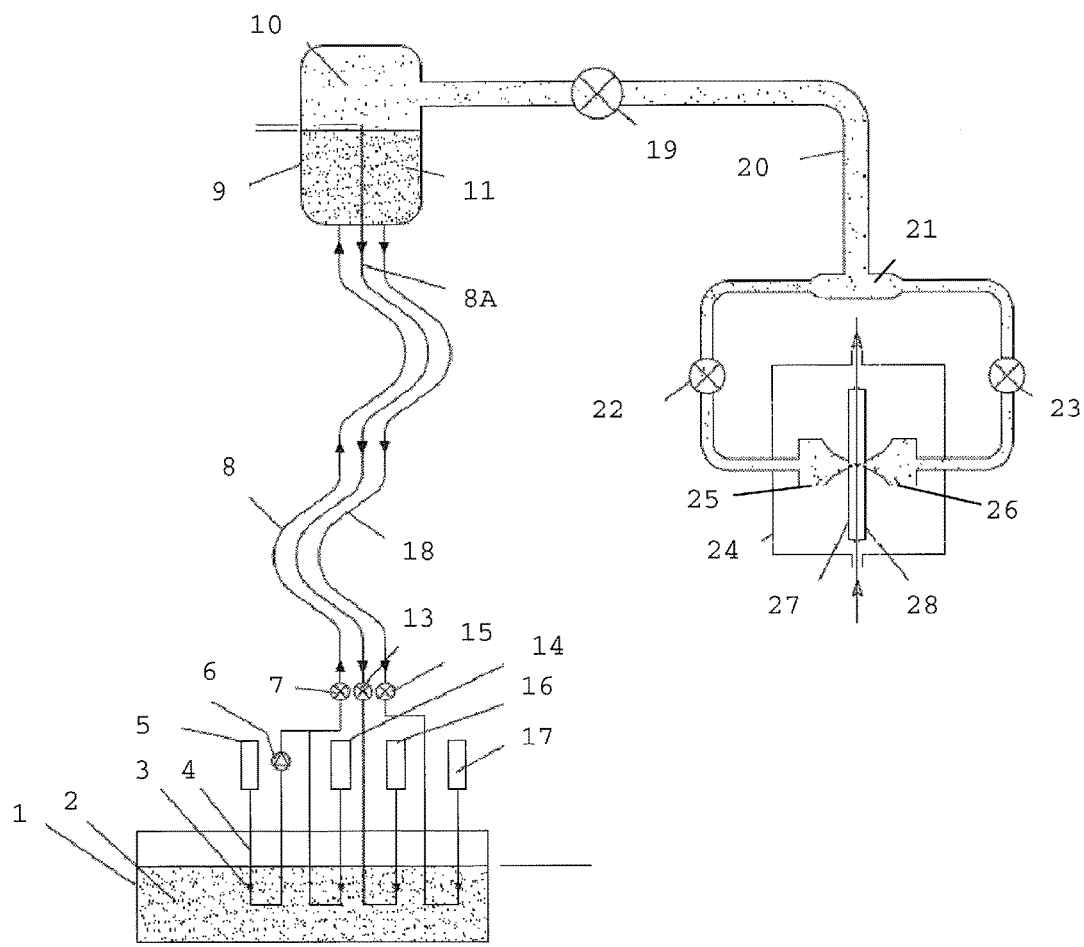

remaining portion of said pipes (8,8A,18) and in the evaporator pipe (9), to melt or solidify the metal found in that location.

14 Claims, 4 Drawing Sheets

(51) Int. Cl.
*C23C 14/16* (2006.01)
*C23C 14/56* (2006.01)

(58) Field of Classification Search
USPC .......................................................... 118/726
See application file for complete search history.

(56) References Cited

U.S. PATENT DOCUMENTS

2010/0104752 A1\* 4/2010 Choquet ................. C23C 14/16
427/250
2011/0000431 A1 1/2011 Banaszak et al.

FOREIGN PATENT DOCUMENTS

EP 2048261 A1 4/2009
WO WO 2005/116290 A1 12/2005

\* cited by examiner

AUTOMATIC SUPPLY DEVICE FOR AN INDUSTRIAL METAL VAPOR GENERATOR

FIELD OF THE INVENTION

The present invention relates to a device for automatically supplying liquid metal to an industrial vapor generator. The latter is used to continuously vacuum coating a metal strip in motion, using metal vapor, with a view to form a layer of metal and preferably a layer of metal alloy on its surface, so as to impart excellent resistance to corrosion while preserving good stamping and weldability characteristics.

The invention falls within the continuation of the earlier applications EP 1 972 699 and EP 2 048 261 relative to metal vapor generators using jet vapor deposition (JVD). More particularly, EP 1 972 699 describes a method and equipment for JVD coating supplied with vapor by means of a furnace and of an evaporation pot connected to each other by supply and return pipes, allowing to deposit metal alloys. EP 2 048 261 describes a vapor generator comprising a furnace and an evaporator pot connected by a supply pipe and also comprising means for adjusting the flow rate, pressure and/or speed of the metal vapor at the level of the JVD deposition head. Also known is WO 2005/116290, which describes a facility for vacuum evaporation deposition comprising a melting pot and at least one evaporation pot connected by a heated pipe, provided with a magnetohydrodynamic system allowing to maintain the molten metal at a constant level in the evaporation pot.

TECHNOLOGICAL BACKGROUND AND STATE OF THE ART

As described in the aforementioned patent applications, vapor is generated starting from an induction-heated pot. The injected energy from which the losses are taken corresponds to the molar evaporation volume. The correlation is completely linear.

This vapor generator must be supplied with metal so as to compensate for the evaporated volumes. After having examined different supply modes, a supply with liquid metal was selected. On a continuous industrial line, the supply must in fact be automatic. On a steel line for coating using magnesium or zinc, the strip deposition involves hundreds of kg, or even tons of metal per hour. The supply of the pot may not be directly in solid form (cord, granulates, ingots, etc.), as that would for example require the use of an airlock system with vacuum compartments, which is too complex. In the present technology, the pot is supplied with liquid metal pumped into a pipe from a melting furnace located below the pot and at atmospheric pressure.

Furthermore, in the pot, only the species for which the obtained saturating vapor pressure enables evaporation will evaporate. The other species will remain in the pot and build up. This is a form of distillation. All of the impurities contained in the basic metal (which is not 100% pure for cost reasons) that are impossible or difficult to evaporate will thus build up in the pot. Their concentration will end up hindering, or even preventing evaporation. These impurities must therefore be eliminated periodically or continually.

Among the materials that may build up in the evaporation pot are in particular metal oxides of the basic metal. These oxides primarily come from the filling metal, which is generally purchased in ingots whereof the outer surface is oxidized. A digital simulation on an industrial prototype with a moderate evaporation capacity showed that the concentration level of impurities could reach 10%, after 40 hours of production and considering a basic material with a purity of 99.8% (magnesium). The oxides that are present may either decant or float due to their separation from the basic metal by segregation. In this second separation mode, they can greatly influence evaporation.

With vapor generators for this type of facility, the following problems or requirements therefore arise:
  startup of the facility while the evaporation pot is empty;
  prevention, during startup, in the event of a leak through a vapor distribution valve, of the evaporation of the metal in the pipe, toward the vacuum deposition head. These leaks are very harmful, as they cause static depositions on the strip in standby (in the form of beads). Furthermore, compensating the evaporation flow rate, and the large quantity of energy taken from the metal (latent evaporation heat), requires major additional power. To prevent cooling of the liquid metal, it would be necessary to install considerable power over the entire length of the liquid pipes, which is technically impossible given the power density per surface unit that would need to be installed;
  startup of the melting furnace and prevention of metal evaporation under the effect of the vacuum;
  preventing the formation of a solid plug on the free surface of the furnace and in the pipes, due to the evaporation and which would prevent the conversion to liquid form and the supply of the pot;
  prevention of the solidification of the metal in the supply pipe, which would otherwise lead, during re-melting, to a break of the pipe under the effect of the metal expansion;
  emptying of the pipes containing the liquid so as to be able to avoid the previous issue and to be able to disassemble the pipes for the maintenance thereof;
  startup of the melting furnace, which requires more than 10 hours of heating, without having to heat the entire remainder of the facility or to create the vacuum. In fact, the heating necessary for the remainder of the facility to avoid condensation of the vapors on the cold wall is much shorter (e.g., 2 hours);
  allowing to solidify in the pipes without breaking them.

AIMS OF THE INVENTION

The present invention aims to overcome the drawbacks of the state of the art.

The present invention aims to supply the evaporation pot from the melting furnace, while ensuring recirculation of the liquid metal, under optimal safety and quality conditions.

The invention also aims first to start up the melting furnace without having to create a vacuum or heat the remainder of the facility, which is used for evaporation.

The invention also aims to allow easy startup and stopping of the facility.

The invention also aims to allow solidification of the liquid metal without creating a solid plug on the free surface of the furnace or in the supply pipes with the risk of breaking the latter during re-melting, due to the metal expansion.

BRIEF DESCRIPTION OF THE INVENTION

The present invention relates to a facility for the continuous vacuum deposition of a metal coating on a substrate in motion, comprising a vacuum deposition enclosure, at least one sonic vapor jet deposition head connected to an evaporator pot designed to contain the coating metal in liquid form through a vapor supply pipe provided with a distribution valve, and a melting furnace for said metal, said furnace being at atmospheric pressure, located below the lowest portion of the evaporator pot and connected to the evaporator pot by at least one automatic supply pipe for the evaporator pot provided with a supply pump and by at least one return pipe for the liquid metal optionally provided with a valve, regulating means for the supply pump further being present to regulate a determined liquid metal level in the evaporator pot, the facility comprising, in each of said supply and return pipes, a so called heat valve area provided with a heating device and with a cooling device to obtain a regulated temperature, independent of that of the melting furnace, of that prevailing in the remaining portion of said pipes and in the evaporator pot, to melt solidify the metal found in that location.

In the context of the present invention, the sonic vapor jet deposition method is used, as in particular described in patent EP 909 342.

According to specific embodiments of the invention, the facility further comprises one or a suitable combination of the following features:
- the facility comprises means allowing to generate metal vapor in a localized manner, between the furnace and the coating head;
- the facility comprises a device for retaining liquid metal situated in the bottom of the evaporator pot, to generate metal vapor in a localized manner;
- the facility comprises an extra pot connected to the vapor supply pipe, to generate metal vapor in a localized manner;
- said heat valve(s) are made up of a double enclosure, in which the cooling occurs by injection and circulation of a coolant;
- the supply pipe is provided with a bypass valve allowing to use the supply pipe as an emptying tube;
- said pipes are made from a dual-material, the inside being made up of a non-welded tube made from low-carbon steel, graphite or SiAlON, outwardly coated with stainless steel;
- the tubes are placed in a second metal enclosure in the form of a bellows;
- the connection between the melting furnace and the evaporator pot is provided by a rigid reference bar and the pipes are made in the form of a lyre;
- the pipes are fastened to each other as well as to the furnace and to the evaporator pot by metal flanges, the vacuum sealing being obtained by superimposing an inflatable metal seal and a graphite seal;
- the evaporator pot communicates with an inert gas distribution device, so as to use its pressure to push the liquid metal back into the melting furnace.

The present invention also relates to a method for starting up the facility as described above, according to which:
- the melting of the metal in the furnace is started, while keeping the metal in the solid state in the heat valves of the supply and return pipes;
- the remainder of said facility is heated to the temperature necessary to receive the liquid metal and/or the metal vapor, the distribution valve of the supply pipe is closed, and the deposition enclosure is placed under vacuum;
- said means allowing to generate the metal vapor in a localized manner are activated, at a temperature higher than that of the liquid metal in the facility during deposition;
- the solidified metal contained in the heat valves is melted;
- the evaporator pot is then filled using the supply pump, the distribution valve of the supply pipe is opened, and the deposition of metal on said substrate in motion begins.

Advantageously, the height of the evaporator pot relative to the melting furnace is determined so that the free liquid metal surface in the supply pipe is situated below the pot, when the vacuum is achieved in the facility, the supply pump not being in operation.

The invention lastly relates to a method for implementing the facility as described above, for which the substrate is a metal strip and the metal coating is made up of magnesium or zinc.

SHORT DESCRIPTION OF THE DRAWINGS

FIG. 1 diagrammatically shows an overall view of an industrial metal vapor generator according to the present invention.

Figure 2:
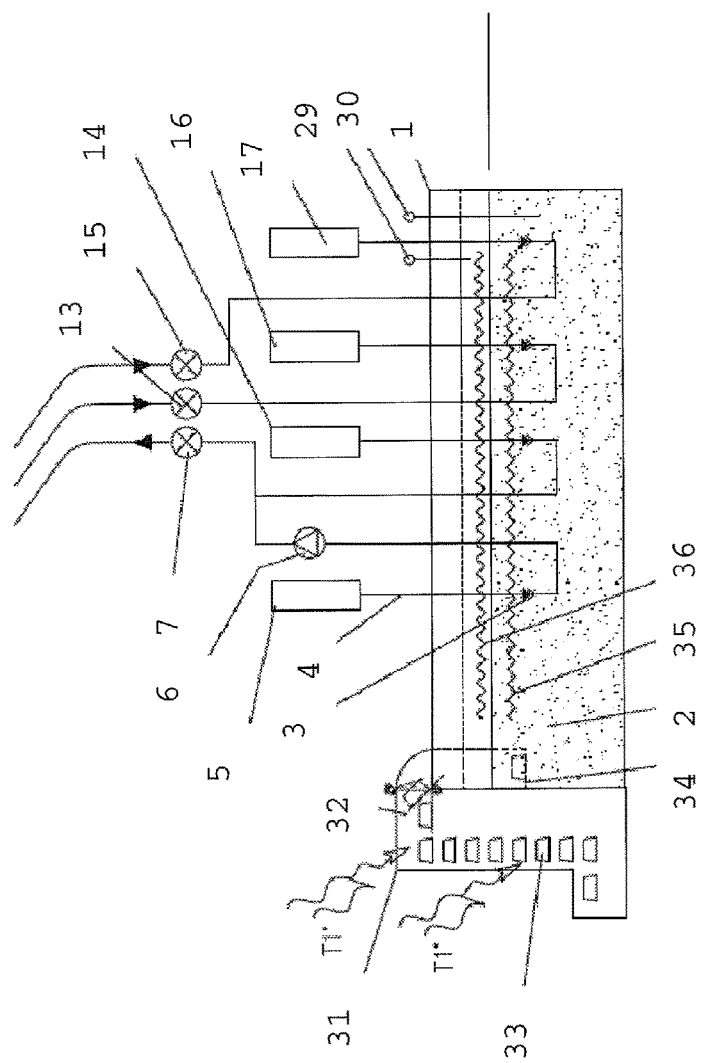

FIG. 2 diagrammatically shows one embodiment of the melting furnace of said generator.

Figure 3:
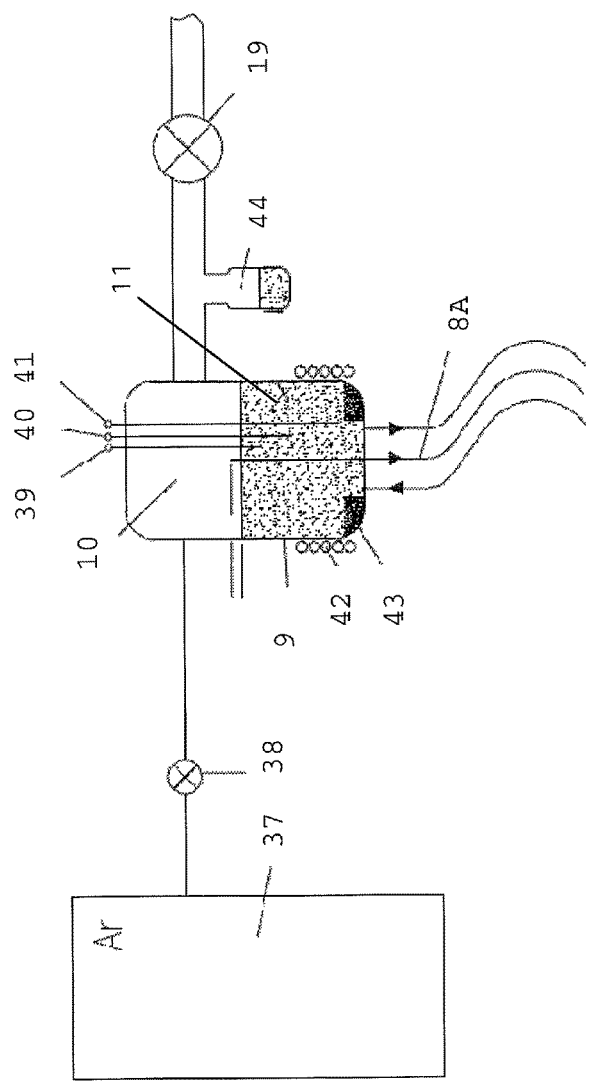

FIG. 3 diagrammatically shows one embodiment of the evaporation pot of said generator.

Figure 4:
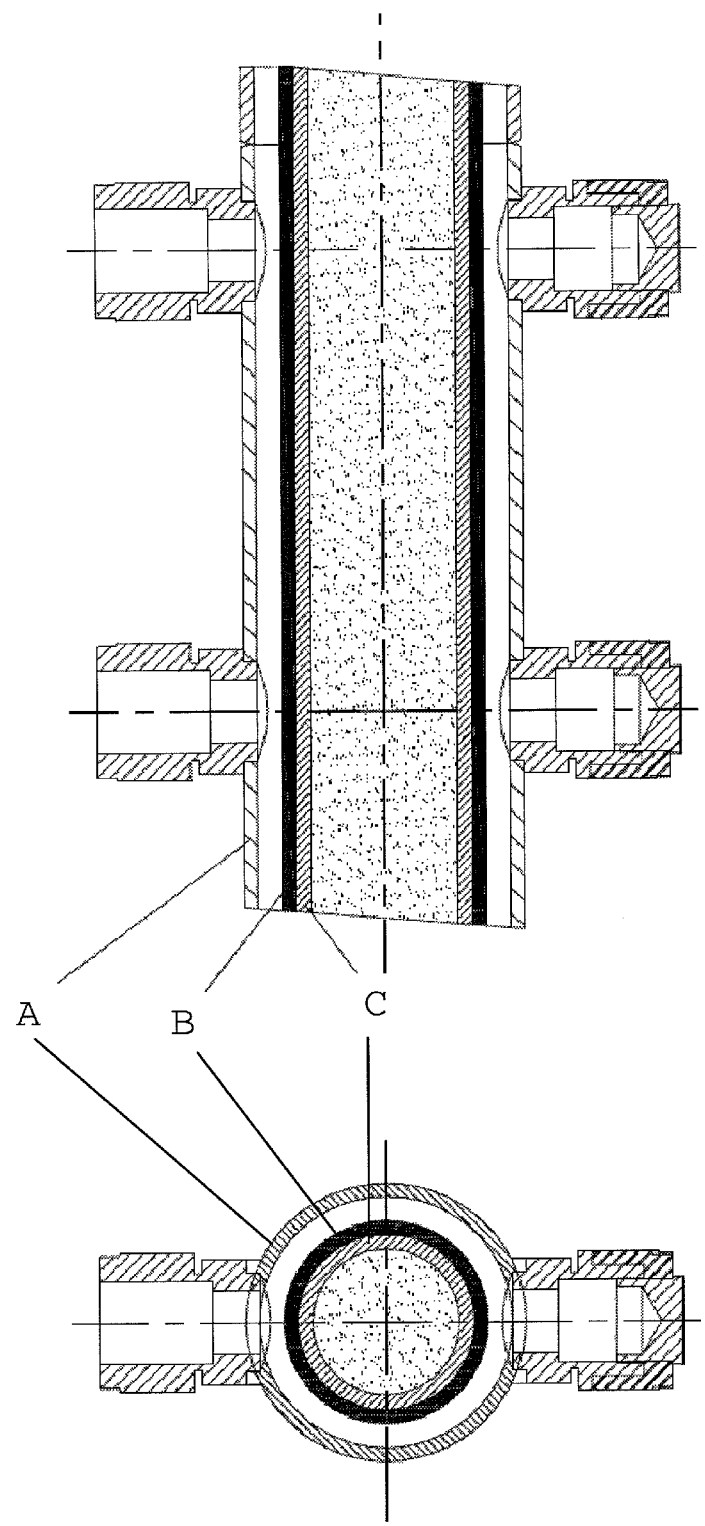

FIG. 4 shows a cross-sectional view of one example of a pipe designed for liquid magnesium.

DETAILED DESCRIPTION OF THE INVENTION

The facility may be assembled and used in different ways. Reference will be made hereafter to FIGS. 1 and 3, which describe one preferred embodiment of a facility for depositing magnesium or zinc on a steel strip in continuous motion. The facility therefore comprises a vapor generator provided with at least one vacuum evaporation pot 9 (or evacuator pot) heated by induction and supplied by a melting furnace 1. Positioned between the melting furnace 1 and the evaporator pot 9 are pipes 8,8A,18 allowing not only the renewed supply of the pot 9 with metal to be evaporated 2, but also the continuous or non-continuous recirculation between the two pieces of equipment, namely the melting furnace 1 and the evaporator pot 9. The evaporator pot 9 is connected to the coating head by a vapor supply pipe 20 comprising at least one vapor distribution valve 19 allowing to isolate the evaporator pot 9 from the vacuum deposition enclosure 24.

The melting furnace 1, shown in FIG. 2, is supplied with solid metal, for example in the form of ingots 33,34, through an automatic supply device 31,32 with preheating of the ingots to prevent any moisture from entering the furnace.

The melting furnace 1 preferably has a capacity (in kg/h) higher than the mass flow of the evaporator pot 9, the ratio between the capacity of the furnace and the flow rate of the evaporator preferably being comprised between 2 and 25, and more particularly preferably between 10 and 25. In this way, it is possible to ensure very good uniformity of the temperature even during the melting of one or more new ingots 34. It is for example possible to choose a capacity of 800 kg/h for a need of 50 to 100 kg/h in terms of the evaporation.

Furthermore, the melting furnace 1 preferably has a capacity (in $m^3$ or kg) higher than the capacity of the evaporator pot 9, and therefore large with respect to the recirculation flow rate. The ratio between the capacity of the melting furnace and the capacity of the pot is preferably comprised between 2 and 10, and more particularly preferably between 5 and 10. For example chosen, for the prototype considered here, an 800 kg furnace was chosen for a capacity of the evaporation pot of 250 kg.

The fact that the melting furnace has a large capacity compared to the evaporator pot and to the recirculation flow rate implies that there is little or no agitation in the furnace. There is thus segregation of the impurities and decantation or float. The bottom and the surface of the liquid metal contained in the furnace may regularly be cleaned to eliminate the impurities brought in by the ingots and the oxides generated during the melting of the ingots. Pumping is then preferably achieved in an area distant from the surface or from the bottom to supply the evaporator pot with relatively pure metal while introducing a minimum quantity of pollutants therein.

In one preferred embodiment, the melting furnace 1 manages the heating differently, depending on its filling level:

when the melting furnace is full (and hence the evaporator pot empty), the melting furnace is heated over its entire height;

when the melting furnace is not full (and hence the evaporator pot full), the melting furnace is heated over the entire filling height, the upper portion being simply maintained at temperature.

In the melting furnace, two levels are therefore distinguished: a full level and an intermediate level, i.e., a level obtained by subtracting the volume contained in the evaporator pot from the full level. This means that the additions, whether automatic or not, of ingots must be achieved taking into account one or the other of the levels, and therefore the operating state of the facility. Level sensors in the furnace 29,30 allow to manage the two levels depending on whether the evaporation pot is empty or full.

It will also be noted that there is space in the melting furnace 1 for the metal contained in the evaporator pot 9, which allows to empty the latter.

As previously seen, the facility according to the invention comprises an evaporator pot 9 made from a material suited to the nature of the liquid metal it contains. In the case of magnesium, it is for example possible to use a pot made from a low-carbon steel, while in the case of zinc, the pot may be made from a compatible material such as graphite, SiAlON (silicon-aluminum-oxygen-nitride), etc. This pot is preferably heated by an induction device 42 and may comprise, in one preferred embodiment, a measurement of the liquid metal level using high-frequency electromagnetic probes 39,40,41 chosen to have a frequency distinct from the induction heating device 42.

According to the invention, the evaporation pot 9 is connected to the furnace 1 by at least one metal supply pipe 8 and by at least one return pipe 8A,18 allowing to ensure recirculation of the liquid metal (FIG. 1). The implementation of this recirculation between the furnace 1 and the evaporation pot 9 allows to reduce the residual impurity level to a value of approximately 2% for a recirculation of a few percent of the supply flow rate. Eliminating the impurities by recirculation thus allows to achieve equipment that can work 24 hours a day without interruption to clean the evaporation pot.

The supply pipe 8 is used to convey the liquid metal from the furnace 1 to the evaporator pot 9. It is provided with a supply pump 6 that rotates and regulates its speed to ensure the flow rate allowing to reach, then maintain the desired level. In order to empty the pot 9 as quickly as possible, the outlet of the supply pump 6 is preferably equipped with a valve 14 allowing to use the supply pipe 8 of the pot as an emptying tube.

The return pipe(s) 8A,18 serve to convey the liquid metal from the pot 9 towards the furnace 1. The return pipe 8A,18 may be equipped with a return valve 16,17 at its end. This optional rate valve is completely open during emptying of the pot. It is completely closed during filling so as to minimize the duration thereof. It is partially open during coating so as to allow a leakage loss serving as the recirculation flow. This flow is adjusted upon each startup by measuring the emptying speed and adjusting the position of the valve.

One particular type of return pipe is an overflow pipe 8A, so as to set the maximum liquid metal level in the furnace. If the level in the pot 9 rises excessively due to a measurement or management problem (e.g., problem of reliability of the measurement level), the overflow liquid metal may be reoriented toward the melting furnace 1 through that pipe, completely safely.

Another type of return pipe is a recirculation pipe 18, which allows to circulate liquid metal continuously or discontinuously when the levels must be adjusted.

In one preferred embodiment, the facility comprises two return pipes 8A,18, including an overflow pipe 8A and a recirculation pipe 18, each of which can be provided with a valve 16,17.

Each of the valves previously described 14,16,17 is submerged in the melted magnesium so as to be protected from the air and so as not to oxidize, and thus to preserve its properties, characteristics and cleanliness. To operate on the valves, it is necessary to melt the metal and remove the valve from the liquid metal (strictly speaking, the symbols 14, 16 and 17 in the figures show the controls of those valves).

As previously mentioned, the presence of an overflow valve 8A is optional. It is in fact possible to adopt a control in which the flow rate is imposed by the speed of the supply pump 6 and the level of liquid metal is maintained through the opening of the return valve 17. The facility according to this embodiment therefore only comprises one supply pipe and one recirculation pipe.

It is also possible to eliminate the recirculation pipe 18 to keep a supply pipe 8 and an overflow pipe 8A. The evaporator pot 9 then no longer requires a level sensor 40, but only a supply pump 6 with a frequency variator. The frequency manages the recirculation flow and the level corresponds to the overflow. Filling and emptying occur through the same supply pipe 8, which is the one equipped with the supply pump 6.

Lastly, it is also possible to regulate, not by frequency variator and therefore by rotation speed of the supply pump 6, but by leakage loss while allowing part of the flow generated by the supply pump 6 to remain in the furnace by partially opening the valve 14.

The material from which the different pipes used in the facility according to the invention are made is determined as a function of the metal to be evaporated and the type of method selected.

The pipe must in fact be compatible with the liquid metal that it will contain for the entire temperature range that will be used. It must also be mechanically strong and vacuum sealed. It must preserve sufficient mechanical properties even at high temperatures and must outwardly withstand corrosion due to the very high-temperature air that will surround it.

In the case of magnesium coating, it is possible to select a pipe made from a dual-material (see FIG. 4). The inside is formed by a non-welded C tube made from low-carbon steel for a boiler. In fact, this type of tube is perfectly suitable, iron being very difficultly soluble in liquid magnesium (in the order of several ppm). The outside B is made from Inconel. The stainless steel is deposited by melting on the low-carbon steel C tube before being re-melted. In order to limit mechanical stresses, a very solid reference bar (not shown) has been added and provides the connection between the melting furnace and the evaporation pot. It expands identically to the tubes and re-acts the primary mechanical stresses. In order to be able to accept differential expansions for small temperature differences between each of the tubes due to a lack of uniformity of the heating, each tube has been made in the form of a lyre (see FIG. 1). The overall expansion to achieve the temperature of 700° C. of the method in the case of magnesium represented more than 65 mm on the pilot facility and the lyres could only bear several millimeters of differential expansion. The tubes were therefore fixed to each other as well as to the pot and to the melting furnace using Inconel flanges (not shown). The vacuum sealing was obtained by superimposing an inflatable metal seal followed by a graphite seal.

Lastly, still for security reasons, the tubes were placed in a second metal enclosure A in the form of a bellows (see FIG. 4). The second enclosure, which is not very strong, allows to test the sealing of the tube upon each startup and can serve as a temporary reservoir in the event of a break or leak in a tube, for the time needed to empty the facility and secure it. In the case of zinc coating, the compatible material will also be contained in a dual enclosure, in which it is advantageously possible to inject a protective atmosphere or create a vacuum in order to protect the materials, such as graphite, at high temperatures.

The melting furnace 1 is situated at a height lower than that of the evaporator pot 9. The effect of the vacuum created in the facility will pump the liquid metal and will generate a second free surface at a different level from that of the melting furnace 1. This amounts to an evaporation surface situated at a different altitude from that of the melting furnace 1. This difference in altitude depends on two main characteristics: the density of the metal, which also depends on its temperature, and the atmospheric pressure. Even if the valve 7 in the pipe 8 is not completely sealed, gravity alone will prevent filling of the facility under vacuum.

Below are several figures allowing to illustrate this for an atmospheric pressure of 1000 mbar. The manometric head for a pressure of one bar is equal to 10.33 divided by the density of the metal (1 bar=10.33 m water column).

Density of the solid magnesium: 1.74 $kg/dm^3$. Corresponding manometric head: 5.93 m.
Density of the liquid magnesium at 660° C.: 1.59 $kg/dm^3$. Corresponding manometric head: 6.50 m.
Density of the liquid magnesium at 700° C.: 1.56 $kg/dm^3$. Corresponding manometric head: 6.62 m.
Density of the solid zinc: 7.18 $kg/dm^3$. Corresponding manometric head: 1.44 m.

It can thus be seen that, from one metal to the next, the height between the free surfaces and therefore the equipment may be very different. There is thus a factor of 4.5 between zinc and magnesium.

It can also be seen that, as a function of the temperature chosen for the method, the height may also vary considerably, for example several tens of millimeters for magnesium at 660° C. and 700° C.

The atmospheric pressure has also a strong influence, since it represents the force that will be exerted on the free surface of the melting furnace, while the vacuum remains absolute. A variation of the atmospheric pressure of 50 mbar is quite common and may cause a difference of more than 70 mm in the height in the evaporation pot or in the pipes in the case of zinc, and more than 300 mm in the case of magnesium.

The choice has then been made, according to the invention, to use an evaporator pot situated at an altitude such that the underpressure generated by the vacuum does not fill it, irrespective of the atmospheric pressure. When the vacuum is created, advantageously, the molten metal can only rise in the supply 8 and return 18,8A pipes to a level situated at several tens of centimeters below the evaporator pot 9. Then, it is the pressure generated by the supply pump 6 that fills the evaporator pot 9 to the necessary and predetermined level to ensure the evaporation of the metal under optimal conditions. This principle adds a strong notion of security to the facility according to the present invention. Indeed, if the vacuum were sufficient in itself to maintain the height of a significant mass of liquid metal at high temperature (typically several hundred kg), the risk of breaking of the pot or a pipe could create a drop in that significant quantity of liquid metal for as long as the metal has not been forced to go back down toward the melting furnace 1.

Here, stopping the supply pump 6 or opening the valves creates emptying of the evaporator pot 9 and the level returns automatically to its manometric head generated by the underpressure. Liquid metal then only remains in the pipes, which represents only a few liters.

The facility according to the invention lastly comprises a determined and reinforced area 7,13,15 in the pipes 8, 8A and 18, allowing to melt the magnesium without causing the pipe to break. The alloy chosen for this pipe segment is suitable for high pressures and high temperatures. This area, called a "heat valve," is provided with a powerful heating device and a rapid cooling device and is also regulated, allowing to manage, independently of the other areas (melting furnace, evaporation pot and remaining portions of the liquid metal pipes), the desired temperature. It is thus possible to solidify and melt the metal in that area.

According to the present invention, the heat valves may be made up of a dual enclosure and the cooling then occurs by injection and circulation of cool air in the dual enclosure (not shown).

According to the invention, a solid metal plug protecting the facility can thus be produced. A relatively low temperature can also be maintained, preventing or limiting evaporation. It is therefore possible to have the melting furnace and the vacuum above without evaporation in the pipes, or rising of the metal therein. It is thus possible, between two production runs, to maintain the melting furnace containing the metal in its molten state without having the remainder of the facility heated and/or maintained under vacuum. Since the liquid metal is no longer present and never solidified in the pipes, the latter can be disassembled if necessary.

The facility according to the invention may further be provided with the following equipment, considered alone or in combination (FIGS. 2 and 3):

in addition to the primary vapor valve 19, secondary vapor valves 22,23 providing sealing and allowing to have atmospheric pressure in the pot while having a vacuum in the deposition enclosure;

an argon distribution cabinet 37 allowing to send that inert gas into the evaporation pot 9 and thus to push the magnesium 11 back toward the melting furnace;

a holding compartment 43 at the bottom of the evaporation pot or an extra pot 44 on the primary vapor pipe, but before the primary valve 19, said pot being provided with heating means (not shown) allowing to have, in a localized manner, the power necessary to generate a metal vapor at a sufficient pressure for the evaporation in the supply and return pipes of the liquid metal and starting from the solidification of the liquid metal in those pipes. The compartment 43 may advantageously be heated by the induction means 42 of the pot or by any other suitable device.

With these various pieces of equipment, the startup cycle is as follows:

- the melting of the metal is started in the furnace without having to create the vacuum or heat the pipes and the remainder of the facility beforehand;
- the metal is kept solid and therefore at a low temperature in the respective heat valves 7,13,15;
- when the facility is ready, i.e., evacuated and at temperature to receive the liquid metal and/or the vapor, the distribution valves are closed on the vapor pipes and metal vapor is generated, at a temperature higher than that the liquid metal will have in the pipes and the pot, through the additional pot 44 on the pipe at the outlet of the pot or the holding compartment 43 at the bottom of the evaporation pot. This vapor will fill the evaporator pot 9 and the pipes and will prevent evaporation in the heat valves 7,13,15 or on the surface of the liquid rising in the pipes under the effect of the underpressure generated by the vacuum. For example, for magnesium, the liquid will be brought to a temperature between 685 and 690° C. and vapor will be generated starting from the holding compartment 43 or the extra pot 44 at 700° C. For the liquid tending to rise, the atmosphere is already saturated and any evaporation is impossible.

It is then possible to stop the regulation of the heat valves 7,13,15 at a low temperature and to melt the metal found therein by bringing it to the temperature of the furnace. Once it is melted, the metal will rise under the effect of the underpressure in the pipes. The pressure in the evaporator pot 9 due to the generated metal vapor will be several mbar and the volume of the evaporator pot, which is large with respect to the volume of the pipes, allows to preserve that pressure despite the rise of the metal. The evaporator pot may then be filled by acting on the supply pump 6 and on the return valves 14 and others in the melting furnace 1. According to a preferred embodiment of the invention, the same level heightwise as the liquid metal in the melting furnace 1 when the latter is full and the evaporator pot 9 is empty is for example chosen as position of the heat valves 7,13,15. This facilitates the first startup, but any other position is within the application scope of the invention.

To empty the facility, the following operations are performed:

- the valve 19 is closed on the vapor pipe;
- the supply pump 6 is stopped and the valves 14,17 are opened on the pipes 8,18;
- the liquid metal may be pushed back toward the melting furnace by argon pressure. An argon flow is initially managed up to a pressure close to atmospheric pressure before regulating the flow rate to maintain a pressure identical to atmospheric pressure exerted on the melting furnace, so as to stop the metal in the heat valves 7,13,15 at exactly the right altitude;
- after a length of time allowing to ensure proper equilibrium of the situation, the heating of the heat valves may be stopped and their cooling ensured to solidify the metal just inside them. On the pot side, free surfaces are therefore cold and inert;
- the emptied facility can therefore be stopped, without any risk.

The position with "frozen" plugs in the heat valves is called the safety position. Any anomaly observed in the facility and that may be serious automatically generates a forced return to that position (e.g., breakdown of a heating element).

The argon located in the pot can then be released gradually toward the vacuum pumping facility so as to regain the proper vacuum level in the pot if the equipment must be restarted. Otherwise, the argon is left in the pot and constitutes a protective cushion slowing oxidation of the liquid pipes, evaporation pot and free surfaces of the metal in the heat valves.

LIST OF REFERENCE SYMBOLS

1: Melting furnace
2: Magnesium in the melting furnace
3: Supply valve
4,5: Supply valve control
6: Supply pump
7: Supply heat valve
8: Supply pipe of the pot
8A: Overflow pipe
9: Body of the pot (induction-heated)
10: Dome of the pot and vapor reserve (radiation-heated)
11: Magnesium in the pot
13: Overflow heat valve
14: Return valve
15: Recirculation heat valve
16: Overflow valve
17: Return valve
18: Recirculation pipe
19: Primary vapor distribution valve
20: Primary vapor supply pipe
21: Secondary vapor supply valves
22 and 23: Vapor flow rate adjustment valves
24: Deposition enclosure
25,26: Coating heads
27,28: Deposition compartment
29: High level probe
30: Low level probe
31: Ingot feeder, with heating T1
32: Ingot distribution valve
33: Stored ingots
34: Ingot undergoing melting in the furnace
35: Low level heating
36: High level heating
37: Argon distribution cabinet
38: Argon distribution valve
39,40,41: Level probes for the pot
42: Heating inducter for evaporation of the metal
43: Holding compartment at the bottom of the evaporator pot
44: Extra pot to generate vapor
A: Metal enclosure in the form of a bellows
B: Resistant stainless steel coating
C: Non-welded tube made from low-carbon steel

The invention claimed is:

1. A facility for the continuous vacuum deposition of a metal coating on a substrate in motion, comprising a vacuum deposition enclosure (24), at least one vapor jet deposition head (25,26) connected to an evaporator pot (9) designed to contain the coating metal in liquid form (11), through a vapor supply pipe (20) provided with a distribution valve (19), and a melting furnace (1) for said metal, said furnace being at atmospheric pressure, located below the lowest portion of the evaporator pot (9) and connected to the evaporator pot (9) by at least one automatic supply pipe (8) of the evaporator pot (9) provided with a supply pump (6) and by at least one liquid metal return pipe (8A,18) optionally provided with a valve (16,17), regulating means for the supply pump (6) further being present to regulate a determined liquid metal level in the evaporator pot (9), characterized in that it comprises, in each said supply and return pipes (8; 8A,18), a so-called heat valve area (7,13,15) provided with a heating device and a cooling device to obtain a regulated temperature, independent of that of the melting furnace (1), that prevailing in the remaining portion of said pipes (8,8A,18) and in the evaporator pot (9), to melt and solidify the metal found in that location, wherein said supply and return pipes (8, 8A, 18) are provided with said heating device and cooling device only in the heat valve area (7, 3, 15).

2. The facility according to claim 1, comprising means allowing to generate metal vapor in a localized manner, between the furnace (1) and the at least one vapor jet deposition head (25,26).

3. The facility according to claim 2, in which said means allowing to generate the metal vapor in a localized manner comprise a liquid metal retaining device (43) located in the bottom of the evaporator pot (9).

4. The facility according to claim 2, in which said means allowing to generate the metal vapor in a localized manner comprise an extra pot (44) connected to the vapor supply pipe (20).

5. The facility according to claim 1, for which said heat valve(s) are made up of a double enclosure, in which the cooling occurs by injection and circulation of a coolant.

6. The facility according to claim 1, in which the supply pipe (8) is provided with a bypass valve (14) allowing to use the supply pipe (8) as an emptying tube.

7. The facility according to claim 1, for which said pipes (8,18,8A) are made from a dual-material, the inside being made up of a non-welded tube (C) made from low-carbon steel, graphite or SiAlON, outwardly coated or protected with stainless steel (B).

8. The facility according to claim 7, for which the tubes (B, C) are placed in a second metal enclosure in the form of a bellows (A).

9. The facility according to claim 1, for which the connection between the melting furnace (1) and the evaporator pot (9) is provided by a rigid reference bar and the pipes (8; 8A,18) are made in the form of a lyre.

10. The facility according to claim 9, for which the pipes are fastened to each other as well as to the furnace (1) and to the evaporator pot (9) by metal flanges, the vacuum sealing being obtained by superimposing an inflatable metal seal and a graphite seal.

11. The facility according to claim 1, furthermore comprising an inert gas distribution device (37) communicating with the evaporator pot (9).

12. A method for starting up the facility according to claim 2, according to which:
the melting of the metal in the furnace (1) is started, while keeping some metal in the solid state in the heat valves (7,13,15) of the supply and return pipes (8; 8A,18);
the remainder of said facility is heated to the temperature necessary to receive the liquid metal and/or the metal vapor, the distribution valve (19) of the supply pipe (20) is closed, and the deposition enclosure (24) is placed under vacuum;
said means allowing to generate the metal vapor in a localized manner are activated, at a temperature higher than that of the liquid metal in the facility during deposition;
the solidified metal contained in the heat valves is melted (7,13,15);
the evaporator pot (9) is then filled using the supply pump (6), the distribution valve (19) of the supply pipe (20) is opened, and the deposition of metal on said substrate in motion begins.

13. The method according to claim 12, for which the height of the evaporator pot (9) relative to the melting furnace (1) is determined so that the free liquid metal surface in the supply pipe (8) is located below the pot (9), when the vacuum is achieved in the facility, the supply pump (6) not being in operation.

14. A method for implementing the facility according to claim 1, for which the substrate is a metal strip and the metal coating is made up of magnesium or zinc.

* * * * *